(12) United States Patent
Gustafsson et al.

(10) Patent No.: US 7,705,965 B2
(45) Date of Patent: Apr. 27, 2010

(54) BACKSIDE LITHOGRAPHY AND BACKSIDE IMMERSION LITHOGRAPHY

(75) Inventors: Per-Erik Gustafsson, Göteborg (SE); Ulric Ljungblad, Molndal (SE)

(73) Assignee: Micronic Laser Systems AB, Taby (SE)

( * ) Notice: Subject to any disclaimer, the term of this patent is extended or adjusted under 35 U.S.C. 154(b) by 310 days.

(21) Appl. No.: 11/748,667

(22) Filed: May 15, 2007

(65) Prior Publication Data

US 2007/0263187 A1 Nov. 15, 2007

Related U.S. Application Data

(60) Provisional application No. 60/800,328, filed on May 15, 2006.

(51) Int. Cl.
*G03B 27/52* (2006.01)
*G03B 27/42* (2006.01)
*G03B 27/58* (2006.01)

(52) U.S. Cl. .................. 355/53; 355/30; 355/72

(58) Field of Classification Search .................. 355/53; 359/619; 430/322
See application file for complete search history.

(56) References Cited

U.S. PATENT DOCUMENTS

| | | | |
|---|---|---|---|
| 4,952,026 A | 8/1990 | Bellman et al. | |
| 6,809,794 B1 | 10/2004 | Sewell | |
| 2004/0003638 A1* | 1/2004 | Schaefer et al. | 72/41 |
| 2005/0100745 A1* | 5/2005 | Lin et al. | 428/446 |
| 2005/0151942 A1 | 7/2005 | Kawashima | |
| 2005/0170655 A1* | 8/2005 | Bencher et al. | 438/700 |

OTHER PUBLICATIONS

PCT Internationaly Preliminary Report on Patentability for Application No. PCT/EP2007/004304, completed Aug. 13, 2008.

* cited by examiner

*Primary Examiner*—Peter B Kim
(74) *Attorney, Agent, or Firm*—Ernest J. Beffel, Jr.; Haynes Beffel & Wolfeld LLP (57) ABSTRACT

The present disclosure relates to formation of latent images in a radiation sensitive layer applied to a substrate that is transparent to or transmissive of radiation at the exposing wavelength. In particular, it relates to so-called backside lithography, in which the final lens of an exposing system is positioned to project electromagnetic radiation through a first side of the transparent substrate and expose a radiation sensitive layer that overlays a second side of the transparent substrate that is opposite the first side. Five alternative embodiments for further treatment to form a radiation opaque layer corresponding to the latent image (the image or its inverse) are described. These methods and corresponding devices are useful for producing masks (sometimes called reticles), for producing latent images in semiconductor devices and for forming features of semiconductor devices using masks.

24 Claims, 7 Drawing Sheets

BACKSIDE LITHOGRAPHY AND BACKSIDE IMMERSION LITHOGRAPHY

RELATED APPLICATIONS

This application claims the benefit of U.S. Provisional Patent Application No. 60/800,328 filed on 15 May 2006 entitled "Backside lithography/backside immersion." The provisional application is incorporated by reference.

Part of this application, which discloses a backside immersion apparatus, is related to U.S. patent application Ser. No. 10/679,701, filed 3 Oct. 2003, entitled "Method and device for immersion lithography," and assigned to the same assignee, which discloses a lens and immersion supply mechanism. The prior application is incorporated by reference.

BACKGROUND OF THE INVENTION

The present disclosure relates to formation of latent images in a radiation sensitive layer applied to a substrate that is transparent to or transmissive of radiation at the exposing wavelength. In particular, it relates to so-called backside lithography, in which the final lens of an exposing system is positioned to project electromagnetic radiation through a first side of the transparent substrate and expose a radiation sensitive layer that overlays a second side of the transparent substrate that is opposite the first side. Five alternative embodiments for further treatment to form a radiation opaque layer corresponding to the latent image (the image or its inverse) are described. These methods and corresponding devices are useful for producing masks (sometimes called reticles), for producing latent images in semiconductor devices and for forming features of semiconductor devices using masks.

In lithography, resolution is limited by the optical NA (Numerical Aperture) of the lithography system. One way to increase the NA, and the resolution, is to use a medium with higher refractive index between the final lens and the image substrate. This medium can for instance be an immersion liquid or solid.

Figure 1:
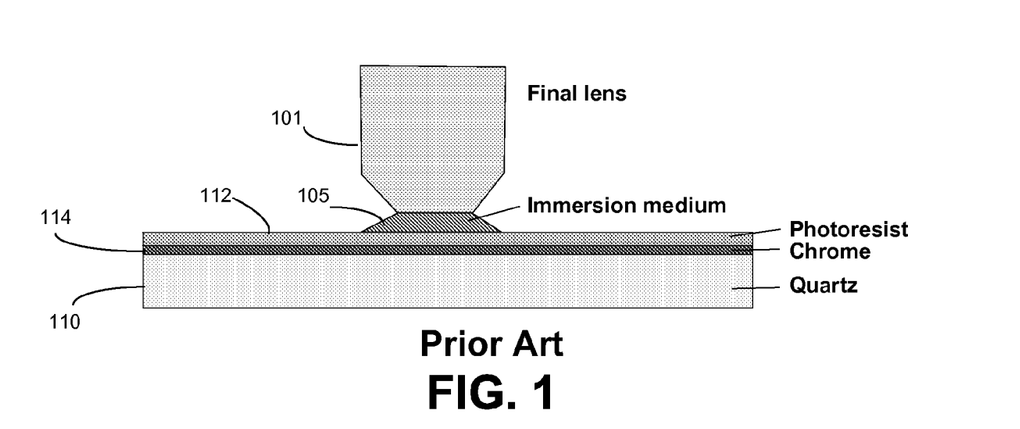
FIG. 1 depicts how immersion lithography might be implemented in an optical photomask writer or generator.

FIG. 1 depicts how immersion lithography might be implemented in an optical photomask generator. A substrate (110) is overlaid by chrome (112) and photoresist (114). The substrate typically is quartz, which has limited transmission wavelengths of electromagnetic radiation shorter than 160 nm, unless prepared to be especially dry with fewer hydroxyl groups in the quartz than normal. Other substrates may be used, depending in part on their transparency to radiation used for patterning, such as Corning's ULE and HPFS glass. Chrome is typically used as an opaque or radiation stopping layer. Photoresist is exposed using the radiation and developed to produce a pattern. The photoresist is exposed to electromagnetic radiation focused by an optical path including a final lens (101). The optical path may include shaped mirrors that help focus radiation of a short wavelength. The final lens may be an interface between vacuum or other containment of a mirror-based optical path and the workpiece. An immersion liquid or solid (105) positioned in contact with both the final lens (101) and the resist layer (114) overlying the substrate is useful because it has a higher refractive index than an air gap. Conventional methods for developing and partially removing a resist layer are known in the art. Patterning the resist is part of forming devices on the substrate, including features of semiconductor devices.

An opportunity arises to develop alternative processes for forming latent images, for creating masks to be used in production of devices and, ultimately, to form features of devices on a device substrate. This may result in better, more easily configured and controlled, more resilient and transparent processes, tools and devices.

SUMMARY OF THE INVENTION

The present disclosure relates to formation of latent images in a radiation sensitive layer applied to a substrate that is transparent to or transmissive of radiation at the exposing wavelength. In particular, it relates to so-called backside lithography, in which the final lens of an exposing system is positioned to project electromagnetic radiation through a first side of the transparent substrate and expose a radiation sensitive layer that overlays a second side of the transparent substrate that is opposite the first side. Five alternative embodiments for further treatment to form a radiation opaque layer corresponding to the latent image (the image or its inverse) are described. These methods and corresponding devices are useful for producing masks (sometimes called reticles), for producing latent images in semiconductor devices and for forming features of semiconductor devices using masks. Particular aspects and embodiments are described in the claims, specification and drawings.

BRIEF DESCRIPTION OF THE DRAWINGS

Illumination of a radiation sensitive layer formed over a transparent substrate, such quartz, ULE or HPFS, is illustrated in FIG. 2.

A so-called "Chrome and Lift-off" process is illustrated by FIG. 4.

A second, so-called "Chromeless" process embodiment is illustrated by FIG. 6.

The absorption curve for a CAR-resist is shown in FIG. 7, for Arch8250 resist, in particular.

A third, so-called "Chrome substitute process" embodiment is illustrated by FIG. 8.

A fourth, so-called "Chrome substitute process with treatment" process is illustrated by FIG. 10.

A fifth, so-called "Chromeless process with treatment" embodiment is illustrated in FIG. 11.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

The interface between the photoresist and immersion liquid can present problems, including acid leaching, resist swelling, resist contamination, drop defect generation and/or resist loss due to immersion liquid/resist interaction during the lengthy writing time required to pattern a photomask. With photoresists available on the market in 2006, it might turn out to be impossible to write photomasks with "normal" immersion lithography, as depicted in FIG. 1. This is due in part to the long delay time between exposure and PEB (Post Exposure Bake). One way to solve the problem would be to develop a new photoresist that works better for photomask immersion lithography. Another way would be to separate the photoresist and the immersion liquid. This can be done with the backside lithography/backside immersion of this disclosure. Backside lithography is done through a transparent substrate. Quartz is an example of a "transparent" substrate, at least when the radiation is 193 nm or 248 nm in wavelength. One of skill in the art will recognize that only especially dry quartz, with reduced hydroxyl groups, is considered usable with a radiation of a 157 nm wavelength. This substrate might, for instance, be the quartz layer of a photomask blank. However, the technology disclosed may also be used for other transparent lithography substrates such as calcium chloride or glasses made by Corning, including ULE and HPFS. It also may be used with thin films on a frame, films such as ET, PEN or Mylar films. This technology is useful for high resolution and image fidelity lithography.

Figure 2:
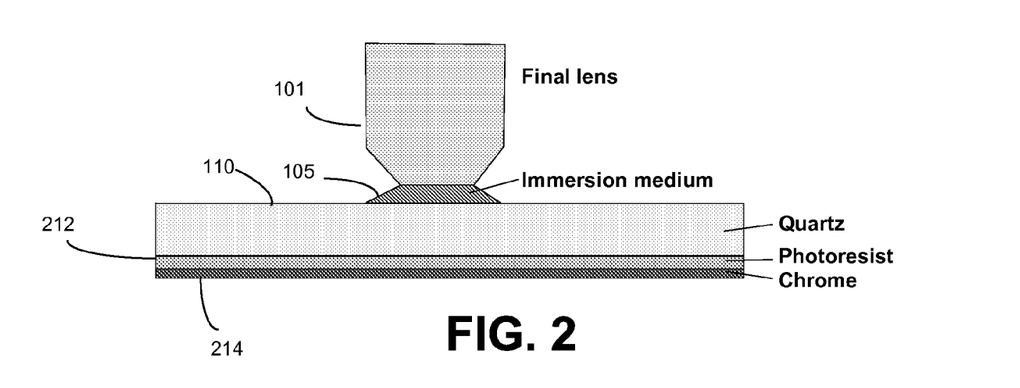

This disclosure proposes lithography and immersion lithography through the substrate, from the side of the substrate opposite to the tide on over which resist is applied. For photomasks, this means illumination of the resist layer applied to the photomask substrate through the quartz as illustrated in FIG. 2. In the figure, we have renumbered the resist (214) and the chrome (212) to emphasize that they are now on the second side of the substrate, opposite a first side that is in contact with the immersion liquid or solid (105). With the immersion liquid on the opposite surface of the substrate from the resist, there will be no interaction between the immersion liquid and the photoresist. If an immersion solid is preferred, LUAG is a candidate.

Figure 3:
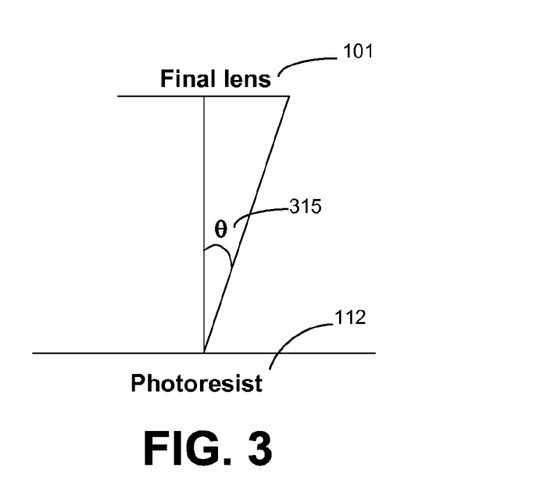
FIG. 3 illustrates how a lower limit of the minimum working distance (the distance between the final lens and the projected image plane in the photoresist) is determined by backside lithography.

FIG. 3 illustrates how a lower limit of the minimum working distance (the distance between the final lens and the projected image plane in the photoresist) relates to mask thickness in backside lithography. The working distance is no less than the thickness of the transparent substrate. This minimum working distance sets a limitation on the minimum final lens radii for a given NA. The size of the final lens is given by $$\begin{cases} NA = n_{medium} \cdot \sin(\theta) \\ r_{lens} = \text{Lens radii} = \text{working distance} \cdot \tan(\theta) \end{cases} \Rightarrow \quad (1)$$

$$r_{lens} = \text{working distance} \cdot \tan\left(\text{Arcsin}\left(\frac{NA}{n_{medium}}\right)\right)$$

where NA is the intended numerical aperture, $n_{medium}$ is the real part of the refractive index for the medium with the lowest refractive index between the final lens 101 and the photoresist 112 and the angle θ. These features are illustrated in FIG. 3. In the figure, the angle 315 between the rim of the lens and the focal point determines the NA, for given media through which the radiation is projected. For example: NA=1.3, substrate thickness=6.25 mm and $n_{medium}=n_{quartz}=1.55$ gives $r_{lens}>9.63$ mm.

In the application of backside lithography/backside immersion there are two or more media between the final lens and the resist, including at least the immersion medium and the transparent substrate.

If the surface(s) between these media are perfectly flat, a difference in the refractive index of the media will result in spherical aberrations that can be removed by controlling the distance between the final lens and the photoresist. The accuracy of current distance controlling systems is good enough to correct for spherical aberrations caused by a difference in refractive index.

Even minute deviations from perfect flatness of the interface surface(s) can cause optical aberrations that are not easily compensated. Non-flatness can be mitigated by matching the refractive index of the immersion medium to the refractive index of the transparent substrate. Then, even large flatness deviations will be of no importance. Therefore, it is useful to tune the refractive index of the immersion medium.

For a photomask blank that is a quartz substrate, tuning the immersion medium is not complicated, but limits the choice of the immersion medium. The refractive index of quartz is usually approximately 1.55, which is also an attractive value for an immersion liquid.

Patterning Process/Process Options

Backside lithography, optionally including backside immersion, requires several modifications to front-side to patterning processes. Here, we present five different process embodiments, which might be chosen for different applications.

Figure 4:
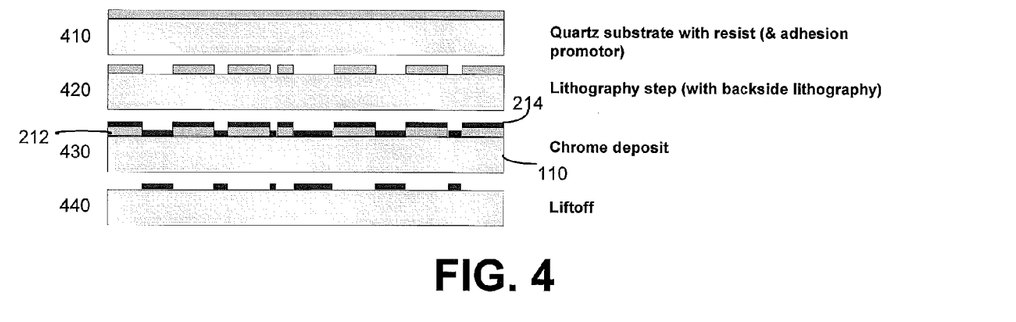

We refer to the first embodiment as "Chrome and Lift-off." In this process is illustrated by FIG. 4:

1) The photoresist is applied directly on the transparent substrate or "glued" to the substrate with an adhesion promoter. This is depicted in 410.

2) The photoresist is exposed through the transparent substrate with backside lithography.

3) The photoresist is developed. The patterning after development is depicted in 420.

4) Chrome (or some other lithography light stopper) is deposited on the patterned photoresist (430).

5) Liftoff removes the remaining resist and the light stopper over those areas of the photoresist, leaving the light stopper on the mask in areas where the developing step had patterned the resist (440). Then the mask is ready.

In FIG. 4, the Chrome and Lift-off process is illustrated with the transparent substrate being quartz and the light stopper being chrome. Other substrate and light stopper materials can, of course, be used.

Figure 5:
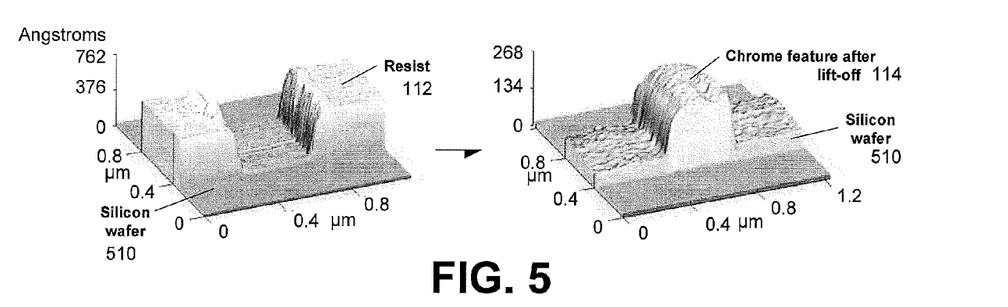
FIG. 5 illustrates results of applying chrome over patterned resist and lifting off areas of the resist.

Using a much different patterning method adapted from atomic force microscopy, researchers have reported that continuous features as small as 26-nm-wide have successfully been patterned and transferred into the silicon substrate using lift-off. See, http://www.stanford.edu/group/quate_group/Litho/LithoPages/ExposureofResist/PMMA.html (viewed 8 May 2007). Reported results of lift-off include FIG. 5, which depicts patterned resist (112) on a silicon substrate, as in 420 of FIG. 4. Chrome is applied as in 430, followed by lift-off as in 440. This leaves a chrome light stopper layer (114) over the substrate (510). It is anticipated that backside lithography will yield similarly small features in the light stopper layer.

Figure 6:
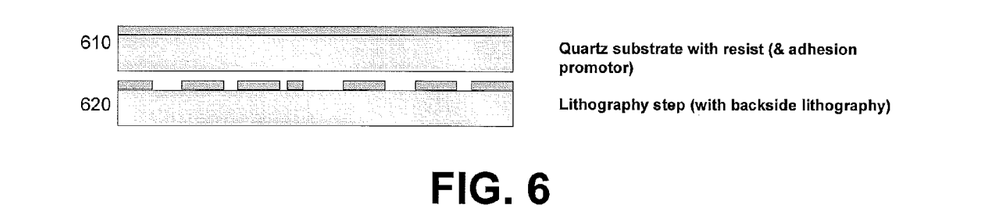

A second, so-called "Chromeless" process embodiment is illustrated by FIG. 6:

1) The photoresist is applied directly on the transparent substrate or "glued" to the substrate with an adhesion promoter. (610)

2) The photoresist is exposed through the transparent substrate with backside lithography.

3) The photoresist is developed (620) and portions of the patterned resist are used as a light stopper. Then the mask is ready. The photoresist serves as the lithography light stopper.

Figure 7:
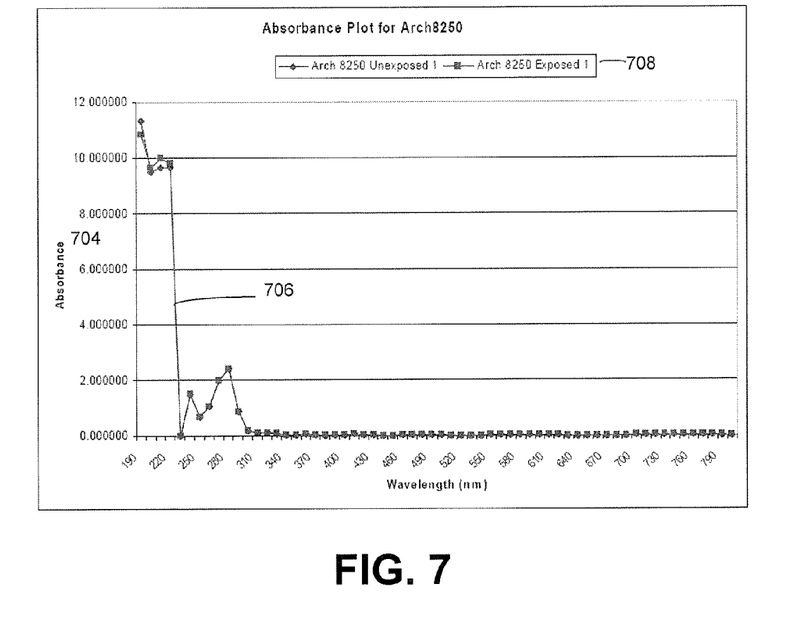

The resist can be effective as a light stopper for a wavelength, typically 193 nm, other than the wavelength used in for backside lithography, typically 248 nm. A typical CAR-resist would be used, for instance FEP171. CAR-resists for 248 nm have very high absorption at 193 nm (similar to chrome). These CAR-resists are considered for this disclosure to "effectively stop" radiation at 193 nm. For these purposes, effectively stop is used in a broad sense as not permitting the radiation to pass, whether it is absorbed and converted into heat or reflected back, as is the case for chrome. Both resist and chrome are considered, in the art, to effectively stop radiation and allow patterning with a mask of a device. An example of the absorption curve for a CAR-resist is shown in FIG. 7, for Arch8250 resist. The x-axis (702) represents the wavelength of the radiation, in nanometers. The y-axis (704) represents absorbance, which drops nearly to zero at the exposing wavelength of 248 nm and is high at 193 nm. The absorbance of this resist is very similar, before and after exposure (708). Based on these absorbance curves (706), a resist applied to a mask should function as a radiation stopping layer in a 193 nm stepper without a chrome layer.

The patterned photoresist will work well as the light stopper of a mask in a 193 nm stepper if the resist has some or all of the following properties. The resist should be thin. Chrome layers are available on mask blanks in 50, 70, 73, 90 nm and other thicknesses. It is expected that a photoresist layer as thin as chrome layers on masks will be thin enough to mitigate polarization effects. A radiation sensitive layer or chrome substitute layer could be prepared in the 50-90 nm thickness range or it might be thicker than a chrome layers, such as 100-300 nm or 200 nm +/−50 nm in particular. The criteria for thin enough is empirical: whether a thicker layer introduces more defects or not. Thinning can, for instance, be achieved by a short time flood exposure at moderately absorbing wavelength prior to post-bake and development and/or by CMP (chemical mechanical planarization) after processing. One may use a thinly applied resist layer for patterning, since the resist can removed without etching. The processed resist also should be resistant to aging. The resist will highly absorb the wavelength of radiation used in a stepper, at least after processing and development to produce a mask.

Figure 8:
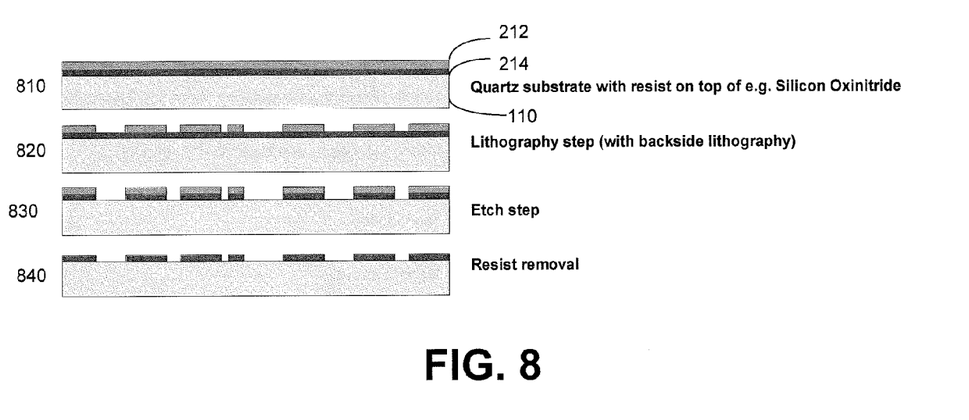

A third, so-called "Chrome substitute process" embodiment is illustrated by FIG. 8. It includes the following process:

1) The photoresist (812) is applied on top of a transparent substrate for chrome (814), i.e. the chrome substitute that is transparent at the backside lithography wavelength. (810) With respect to a chrome substitute, "transparent" means allowing sufficient radiation to pass through the transparent chrome substitute to expose the light sensitive layer on the opposite side of the substrate layer without too much loss or diffraction of light. Passing 75 percent of the exposing radiation may be sufficient for a chrome substitute layer to work. Passing 96 percent of the exposing radiation would be similar to transparent window glass, and certainly would work. A lower percentage also might work well enough to be considered transparent.

2) The photoresist is exposed through the transparent substrate and the transparent chrome substitute with backside lithography.

3) The photoresist is developed. (820)

4) Etch of the chrome substitute is performed. (830)

5) The photoresist is removed. (840) Then the mask is ready.

Figure 9:
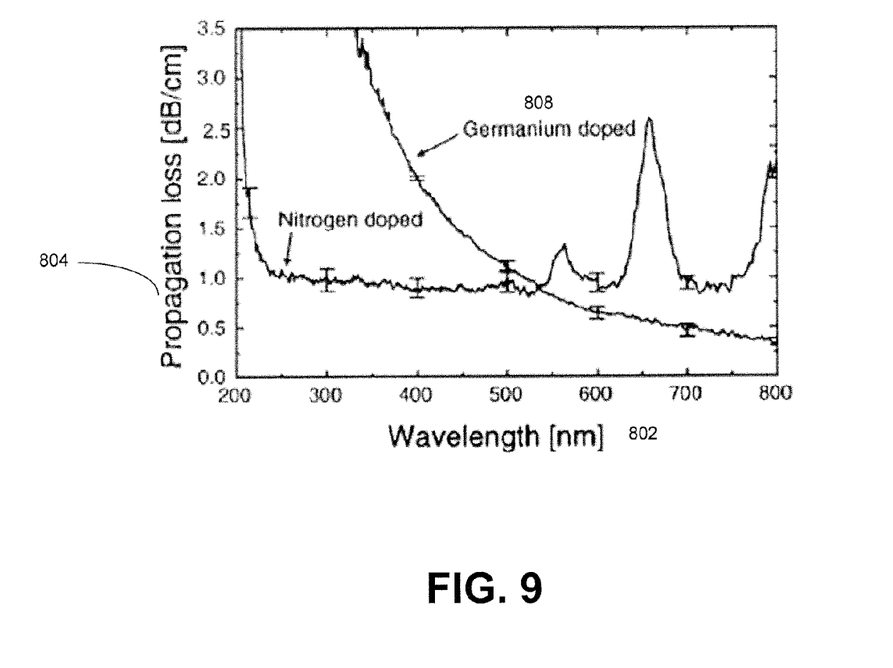
FIG. 9, taken from illustrates tuning of silicon oxynitride (SiOxNy) by varying the proportion of constituents.

This process may be practiced with a transparent quartz substrate and the chrome substitute such as silicon oxynitride (SiOxNy), which is transparent to the backside lithography wavelength. In some embodiments, a 248 nm wavelength backside lithographic writer is used to produce the mask and a 193 nm wavelength stepper uses the mask to pattern device substrates and form features of devices. The substitute for chrome is essentially transparent at 248 nm and highly absorbing at 193 nm. It also should have very good adhesion properties to quartz or other mask substrate. Alternatively, a very thin intermediate layer could act as a "glue" between the quartz and chrome substitute. The intermediate layer might be chrome. In some embodiments, the chrome substitute will be silicon oxynitride (SiOxNy) for which the absorption/transmission threshold can be tuned from 160 nm to 250 nm by tuning the oxygen/nitrogen content. FIG. 9, taken from "Ultraviolet transparent silicon oxynitride waveguides for biochemical Microsystems", Optics Letters, Vol. 25, No. 10 (May 15, 2001), http://www.mic.dtu.dk/upload/institutter/mic/forskning/microtas/artikler/2001/mogensenuv01.pdf (viewed 8 May 2007), illustrates tuning of SiOxNy by varying the proportion of constituents. The x-axis (802) represents the wavelength and the y-axis (804) represents the propagation loss on a logarithmic scale. Results of two types of doping, nitrogen (806) and germanium (808) are graphed. Note that the nitrogen treatment strongly attenuates transmission at 193 nm, but much less so at 248 nm.

Figure 10:
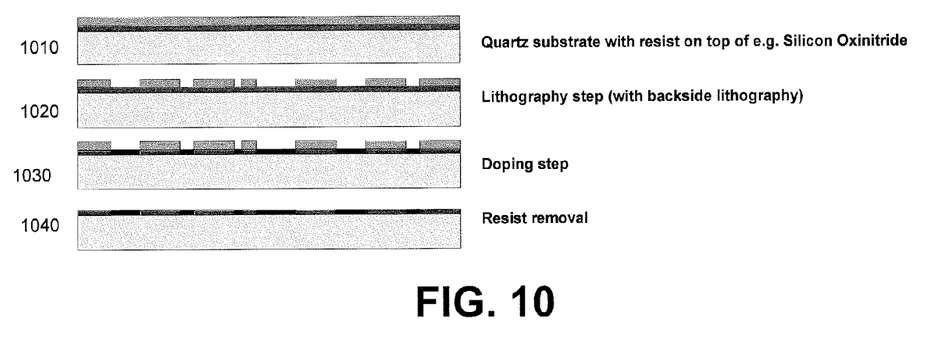

A fourth, so-called "Chrome substitute process with treatment" process is illustrated by FIG. 10. The process includes:

1) The photoresist (1012) is applied on top of a transparent substrate for chrome (1014), i.e. the chrome substitute is transparent at the backside lithography wavelength. (1010)

2) The photoresist is exposed through the transparent substrate and the transparent chrome substitute with backside lithography.

3) The photoresist is developed. (1020)

4) The chrome substitute is treated, using the resist as a mask. One candidate substitute is SiOxNy, which can be produced in situ by converting a silicon oxide. Treatments known to convert silicon oxides to silicon oxynitride include: nitrogen ion implantation, exposure to a nitrogen atmosphere and exposure to nitrogen plasma. Appropriate energies and/or pressures for treatment can be found in the literature. Upon treatment, the chrome substitute becomes absorbing for the wavelength to be used in the stepper. (1030)

5) The photoresist is removed. (1040) This process creates an inverse pattern, but this can easily be shifted in the digital input data or by shifting between negative and positive resists. Then the mask is ready.

This process may be practiced using a transparent quartz substrate and the chrome substitute being silicon oxynitride. As described above and illustrated in FIG. 9, the absorption/transmission threshold for silicon oxynitride can be tuned from 160 nm to 250 nm by controlling the proportions of oxygen and nitrogen.

Figure 11:
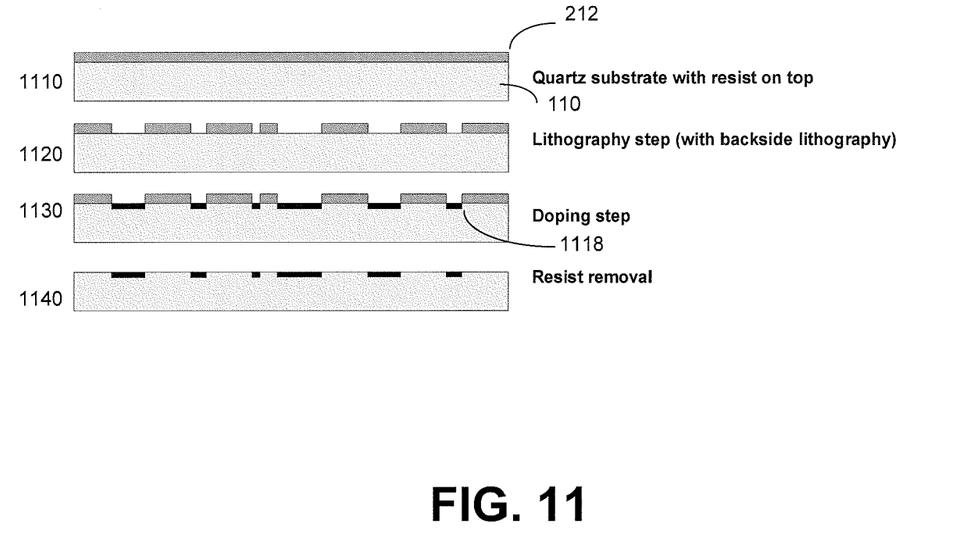

A fifth, so-called "Chromeless process with treatment" embodiment is illustrated in FIG. 11 and includes the following actions:

1) The photoresist is applied directly on the transparent substrate or "glued" to the substrate with an adhesion promoter. (1110)

2) The photoresist is exposed through the transparent substrate with backside lithography.

3) The photoresist is developed. (1120)

4) The quartz substrate (made of silicon oxide) treated to convert it to silicon oxynitride using the resist as a mask (1130), causing the converted substrate to become absorbing for the wavelength to be used in the stepper. The absorption/transmission threshold for silicon oxynitride can be tuned from 160 nm to 250 nm by treatment with oxygen/nitrogen, as described above.

5) The photoresist is removed. (1140) This process creates an inverse pattern but this can easily be shifted in the digital input data or by shifting between negative and positive resists. Then the mask is ready.

As in any microlithography, the exposing radiation is focused on the layer being exposed. For focus, the focal system measures the distance from the final lens to the resist surface. Two approaches would be laser triangulation and offline measurement. A laser triangulation system would optically measure the distance to the resist through the mask and dynamically correct the lens position. This is similar to approaches used for front-side lithography, using laser triangulation to measure distances dynamically during writing. Offline measurement would be performed using an offline measurement station, where the thickness distribution of the mask is measured (by triangulation, interferometry or other measurement method) and stored for use together with a flow sensor measurement system that is used to maintain the correct distance from the lens to the substrate during patterning. Any other focusing system could be used with any of the methods described above.

Figure 12:
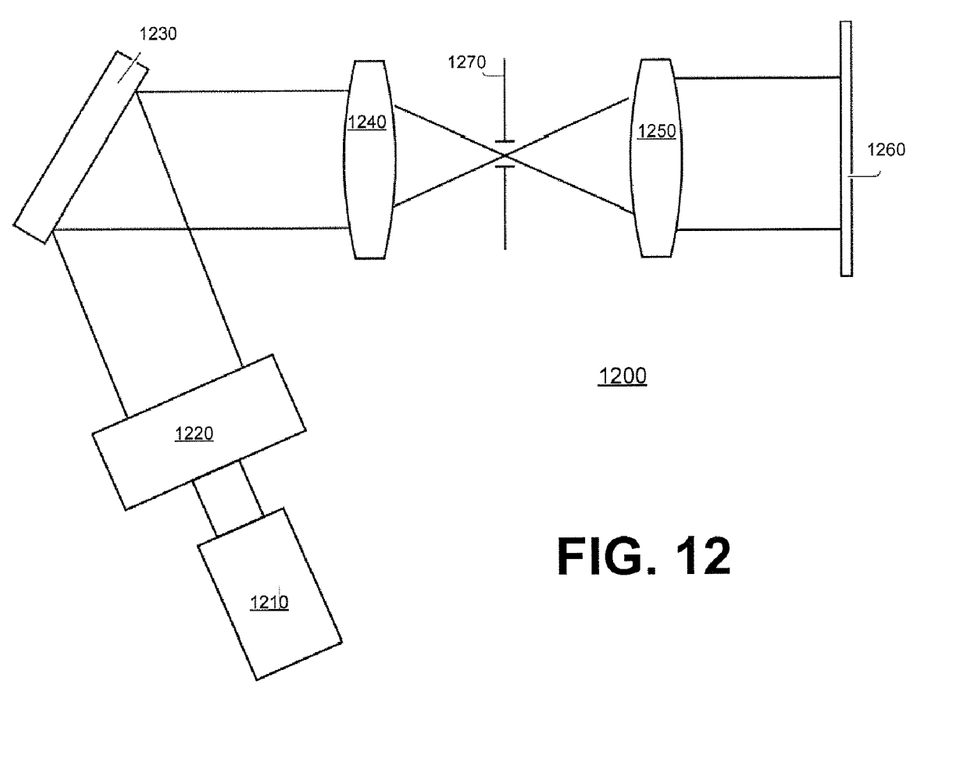
FIG. 12 depicts an immersion assembly previously disclosed in U.S. patent application Ser. No. 10/679,701, filed 3 Oct. 2003, entitled "Method and device for immersion lithography".

FIG. 12 illustrates an embodiment of an apparatus (1200) for patterning a work piece (1260) that Micronic Laser has described in prior patents, into which an immersion assembly could be inserted. The immersion assembly of FIGS. 13A-B could, alternatively, be inserted into a variety of other lithographic writers. The apparatus (1200) includes a source (1210) for emitting electromagnetic radiation, an objective lens arrangement (1250), a computer-controlled reticle (1230), a beam conditioning arrangement (1220), a spatial filter (1270) in a Fourier plane, a Fourier lens arrangement (1240) and a workpiece (1260).

The source (1210) may emit radiation in the range of wavelengths from infrared (IR), which is defined as 780 nm up to about 20 μm, to extreme ultraviolet (EUV). In this application EUV is defined as the range from 100 nm and down as far as the radiation is possible to be treated as electromagnetic radiation, that is, so that it can be reflected and focused by optical components. The source (1210) emits either pulsed or continuous radiation. The emitted radiation from the continuous radiation source (1210) can be formed into a pulsed radiation by means of a shutter located in the radiation path between said radiation source (1210) and said computer-controlled reticle (1230). For example, the radiation source may be a KrF excimer laser with a pulsed output at 248 nm, a pulse length of approximately 10 ns and a repetition rate of 1000 Hz. The repetition rate may be below or above 1000 Hz.

The beam conditioning arrangement (1220) may be a simple lens or an assembly of lenses. The beam conditioning arrangement (1220) distributes the radiation emitted from the radiation source (1210) uniformly over a surface of the computer-controlled reticle (1230). In case of a continuous radiation source, a continuous beam may be scanned over the surface of the computer-controlled reticle or formed to cover the whole computer controlled reticle at once.

The workpiece (1260) is moved in a systematic fashion so that the optical system synthesizes the desired device layer pattern.

The computer-controlled reticle (1230) may be a Spatial Light Modulator (SLM), including an electrostatically controlled micro mirror matrix (one- or two dimensional.) Of course, other arrangements are possible, such as transmissive or reflective SLMs relying on LCD crystals or electrooptical materials as their modulation mechanism, or micromechanical SLMs using piezoelectric or electrostrictive actuation.

The SLM (1230) is a programmable device that produces an output radiation beam that is modulated by separate inputs from a computer. The SLM (1230) simulates the function of a mask through the generation of bright and dark pixels in response to computer fed data. For example the phase SLM (1230) is an array of etched solid state mirrors. Each micromirror element is suspended above a silicon substrate by restoring hinges, which may be supported either by separate support posts or by the adjacent mirrors. Beneath the micromirror element are address electrodes. One micromirror represents one pixel in the object plane. The pixel in the image plane is here defined as to have the same geometry as the micromirror but the size may be different due to the optics, i.e. larger or smaller depending on whether the optics is magnifying or demagnifying.

The micromirror and the address electrodes act as a capacitor so that for example a negative voltage applied to the micromirror, along with a positive voltage to the address electrode, will twist the torsion hinges suspending the micromirror which in turn allow the micromirror to rotate or to move up or down, thereby creating a phase modulation of the reflected light.

A projection system comprises in this embodiment the Fourier lens arrangement (1240) (which may be a compounded tube lens), the spatial filter (1270) and the objective lens arrangement (1250). The Fourier lens arrangement (1240) and the spatial filter (1270) form together what is generally called a Fourier filter. The Fourier lens arrangement (1240) projects the diffraction pattern onto the spatial filter (1270). The objective lens arrangement (1250), which may be a compounded final lens, forms the aerial image on the work piece (1260).

The spatial filter (1270) may be an aperture in a plate. An aperture can be sized and positioned so as to block out essentially all light which is diffracted into the first and higher diffraction orders, for example said aperture may be located at the focal distance from the Fourier lens arrangement (1240). The reflected radiation is collected by said Fourier lens arrangement (1240) in the focal plane, which acts at the same time as a pupil plane of the objective lens arrangement (1250). The aperture cuts out the light from the first and higher diffraction orders of the addressed micromirrors in the SLM, while the radiation from the non-addressed mirror surfaces can pass the aperture. The result is an intensely modulated aerial latent image on the workpiece (1260) as in conventional lithography.

Figure 13A:
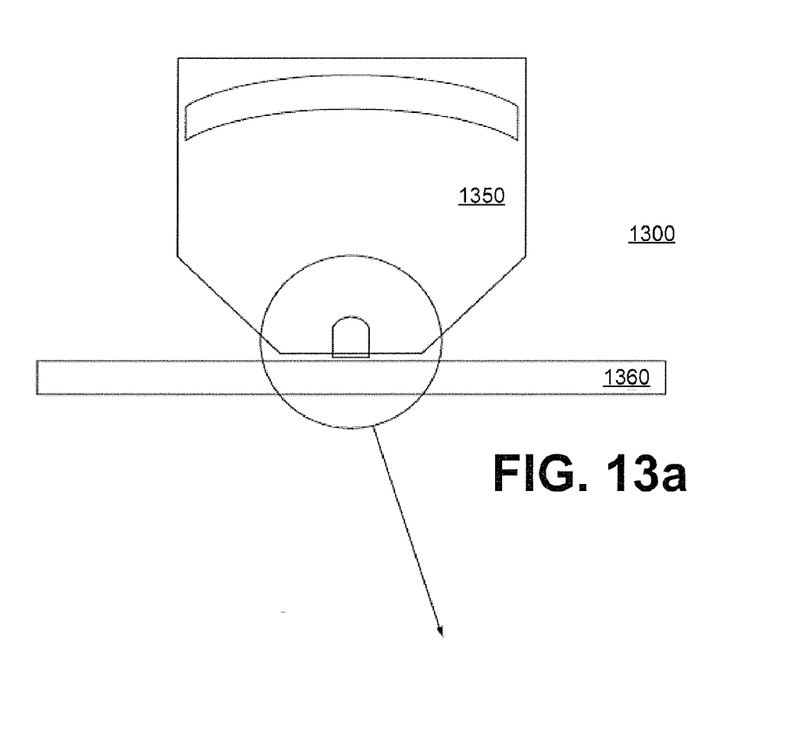
FIG. 13A illustrates immersion optics according to one embodiment of the present invention. An enlarged view of the encircled area in FIG. 13A is illustrated in FIG. 13B.
Figure 13B:
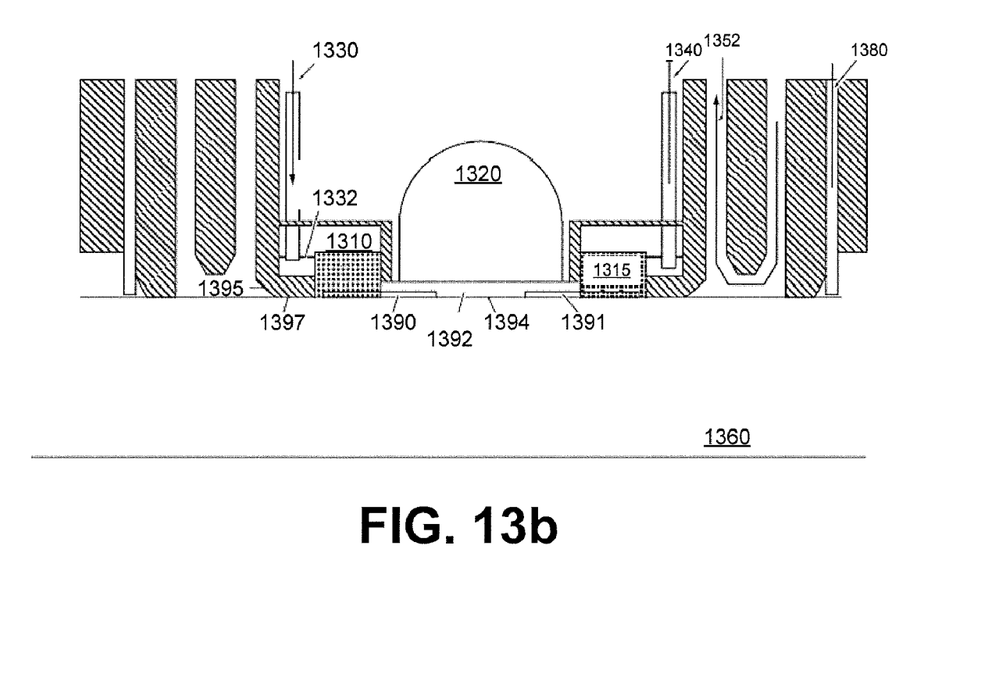

FIG. 13A illustrates immersion optics (1300) according to one embodiment of the present invention. An enlarged view of the encircled area in FIG. 13A is illustrated in FIG. 13B. In FIG. 13A, a workpiece is denoted (1360) and an objective lens denoted (1350). The objective lens (1350) in FIG. 12 is separated from the workpiece by air or any other gaseous medium. In FIGS. 13A-B the objective lens (1350) is in contact with the workpiece (1360) via an immersion medium, normally a liquid.

In the enlarged view FIG. 13B, the details of the objective lens (1350) and its surrounding elements are denoted as follows: an immersion fluid supply tube (1330), an immersion fluid reservoir (1310), a last element of the objective lens (1320), dispenser grooves (1390 and 1391), replaceable flat cover glass (1392), immersion fluid film (1394), a porous element (1315), immersion fluid level (1332), fluid removal tube (1340), drying air (1352), focus air (1380), and the workpiece (1360).

This immersion apparatus or any other could be used to practice backside immersion lithography.

Some Particular Embodiments

The technology disclosed may be practiced as a method or device adapted to practice the method.

A first embodiment is a method of printing a microlithographic pattern on a transparent substrate having a first side and a second side that is opposite the first side, the second side being overlaid by a radiation sensitive layer. This method includes positioning the substrate adjacent to a final lens of an exposing system, with an immersion medium filling a space between the final lens and the first side of the substrate. The immersion medium may be a liquid or solid, using material such as those described above. It further includes focusing an exposing radiation through the first side of the substrate onto the radiation sensitive layer on the second side of the substrate and forming a latent image in the radiation sensitive layer.

One aspect of the first embodiment further includes patterning the radiation sensitive layer, applying a radiation stopping layer over the patterned radiation sensitive layer, and lifting off at least portions of the radiation sensitive layer that remained after the patterning. Consistent with this aspect, the radiation stopping layer optionally may be chrome.

In alternative embodiment which builds upon the first embodiment, the radiation sensitive layer and transparent substrate are used as a mask without a chrome layer. In this embodiment, the radiation sensitive layer is sensitive is exposed to form the latent image and effectively stops passage of radiation at a second wavelength used when the mask is used to expose a device substrate.

In another alternative embodiment that builds on the first embodiment, a chrome substitute is applied between the second side and the radiation sensitive layer as a radiation stopping layer. Unlike chrome, this radiation stopping layer is transparent to the exposing radiation used to form the latent image and effectively stops radiation at a second wavelength used when the mask is used to expose a device substrate.

In a further embodiment, a chrome substitute is applied between the second side and the radiation sensitive layer, which becomes a radiation stopping layer when treated. This radiation stopping layer is at least initially transparent to the exposing radiation used to form the latent image. This embodiment further includes developing the radiation sensitive layer and removing at least part of the radiation sensitive layer to expose at least part of the radiation stopping layer. The exposed part of the radiation stopping layer is treated to make it effectively stop radiation at a second wavelength that is used when the mask is used to expose a device substrate. The second wavelength may be the same as the first.

According to an aspect of this embodiment, the method further includes converting the exposed part of the radiation stopping layer into silicon oxynitride (SiOxNy). The converting may be accomplished in a variety of ways. Converting may be accomplished by exposing the exposed part of the radiation stopping layer to nitrogen ion implanting, to a nitrogen atmosphere or to nitrogen plasma.

In another embodiment that varies the first embodiment, areas of the transparent substrate are treated to convert those areas into a radiation stopping layer, instead of converting a chrome substitute layer. This method includes developing the radiation sensitive layer and removing at least part of the radiation sensitive layer to expose at least part of the transparent substrate, then treating the exposed part of the transparent substrate to make it effectively stop radiation at a second wavelength used when the mask is used to expose a device substrate. The second wavelength may be the same as the first.

An aspect of this embodiment further includes converting the exposed part of the transparent substrate layer into silicon oxynitride (SiOxNy). The converting may be accomplished in a variety of ways. Converting may be accomplished by exposing the exposed part of the radiation stopping layer to nitrogen ion implanting, to a nitrogen atmosphere or to nitrogen plasma.

Any of the embodiments, methods or aspects above can be extended directly to producing a mask, using the mask to expose a radiation sensitive layer on a device substrate, patterning the device substrate and producing a feature of a device on the device substrate.

A microlithographic device adapted to backside lithography of a workpiece has also been disclosed. The device includes a pattern writer, a final lens component of the pattern writer, a stage component of the pattern writer, adapted to hold a transparent workpiece that has a first side and a second side opposite the first side, and a radiation sensitive layer over the second side, and an immersion medium supplied to fill a space between the final lens and the first side of the transparent workpiece when exposing the radiation sensitive layer to exposing radiation supplied through the final lens, the immersion medium, the first side, and the transparent substrate to the radiation sensitive layer. The immersion medium may be a liquid or solid.

Optionally, in this embodiment the first refractive index of the immersion medium may be tuned to match a second refractive index of the transparent workpiece, whereby optical aberrations produced at an interface between the immersion medium and the first side are reduced or practically eliminated.

While the present invention is disclosed by reference to the preferred embodiments and examples detailed above, it is understood that these examples are intended in an illustrative rather than in a limiting sense.

We claimed as follows:

1. A method of printing a microlithographic pattern on a transparent substrate having a first side and a second side that is opposite the first side, the second side being overlaid by a radiation sensitive layer, the method including:

positioning the substrate adjacent to a final lens of an exposing system, with an immersion medium filling a space between the final lens and the first side of the transparent substrate; and focusing an exposing radiation from a pattern writer through the first side of the transparent substrate onto the radiation sensitive layer that overlays the second side of the transparent substrate and forming a latent image in the radiation sensitive layer;

whereby the latent image corresponds, positively or negatively, to at least part of a mask pattern suitable for exposure of a device substrate.

2. The method of claim 1, further including patterning the radiation sensitive layer, producing a mask, using the mask to expose a device substrate, patterning the device substrate and forming a feature of a device.

3. The method of claim 1, further including patterning the radiation sensitive layer, applying a radiation stopping layer over the patterned radiation sensitive layer, and lifting off at least portions of the radiation sensitive layer that remained after the patterning.

4. The method of claim 3, wherein the radiation stopping layer is chrome.

5. The method of claim 3, further including producing a mask, using the mask to expose a device substrate, patterning the device substrate and forming a feature of a device.

6. The method of claim 1, wherein the transparent substrate and any applied layers are used as a mask and the radiation sensitive layer is sensitive to the exposing radiation used to form the latent image and effectively stops passage of radiation at a second wavelength used when the mask is used to expose a device substrate.

7. The method of claim 6, further including patterning the radiation sensitive layer, producing a mask, using the mask to expose a device substrate, patterning the device substrate and forming a feature of a device.

8. The method of claim 1, wherein the transparent substrate is used as a mask, further including providing a radiation stopping layer between the second side and the radiation sensitive layer, the radiation stopping layer being transparent to the exposing radiation used to form the latent image and effectively stopping radiation at a second wavelength used when the mask is used to expose a device substrate.

9. The method of claim 8, further including patterning the radiation sensitive layer, producing a mask, using the mask to expose a device substrate, patterning the device substrate and forming a feature of a device.

10. The method of claim 1, wherein the transparent substrate is used as a mask, further including:
    providing a radiation stopping layer between the second side and the radiation sensitive layer, the radiation stopping layer being transparent to the exposing radiation used to form the latent image; and
    developing the radiation sensitive layer and removing at least part of the radiation sensitive layer to expose at least part of the radiation stopping layer; and
    treating the exposed part of the radiation stopping layer to make it effectively stop radiation at a second wavelength used when the mask is used to expose a device substrate.

11. The method of claim 10, further including converting the exposed part of the radiation stopping layer into silicon oxynitride (SiOxNy).

12. The method of claim 11, wherein the converting includes exposing the exposed part of the radiation stopping layer to nitrogen ion implanting.

13. The method of claim 11, wherein the converting includes exposing the exposed part of the radiation stopping layer to a nitrogen atmosphere.

14. The method of claim 11, wherein the converting includes exposing the exposed part of the radiation stopping layer to a nitrogen plasma.

15. The method of claim 10, further including producing a mask, using the mask to expose a device substrate, patterning the device substrate and forming a feature of a device.

16. The method of claim 1, wherein the transparent substrate is used as a mask, further including:
    developing the radiation sensitive layer and removing at least part of the radiation sensitive layer to expose at least part of the transparent substrate;
    treating the exposed part of the transparent substrate to make it effectively stop radiation at a second wavelength used when the mask is used to expose a device substrate.

17. The method of claim 16, further including converting the exposed part of the transparent substrate layer into silicon oxynitride (SiOxNy).

18. The method of claim 17, wherein the converting includes exposing the exposed part of the transparent substrate to nitrogen ion implanting.

19. The method of claim 17, wherein the converting includes exposing the exposed part of the transparent substrate to a nitrogen atmosphere.

20. The method of claim 17, wherein the converting includes exposing the exposed part of the transparent substrate to a nitrogen plasma.

21. The method of claim 16, further including producing a mask, using the mask to expose a device substrate, patterning the device substrate and forming a feature of a device.

22. A microlithographic device adapted to backside lithography of a workpiece, the system including:
    a pattern writer;
    a final lens component of the pattern writer;
    a stage component of the pattern writer, adapted to hold a transparent workpiece that has a first side and a second side opposite the first side, and a radiation sensitive layer over the second side; and
    an immersion medium supplied to fill a space between the final lens and the first side of the transparent workpiece when exposing the radiation sensitive layer to exposing radiation supplied through the final lens, the immersion medium, the first side, and the transparent substrate to the radiation sensitive layer;
    whereby the pattern writer is adapted to create a latent image on the radiation sensitive layer that corresponds, positively or negatively, to at least part of a mask pattern suitable for exposure of a device substrate.

23. The microlithographic device of claim 22, wherein a first refractive index of the transparent workpiece and a second refractive index of the immersion medium are matched to reduce optical aberrations produced at an interface between the first side and the immersion medium.

24. The microlithographic device of claim 22, wherein the immersion medium is a solid.

* * * * *